United States Patent [19]
Shenoy et al.

[11] Patent Number: 6,037,775
[45] Date of Patent: Mar. 14, 2000

[54] METHOD AND APPARATUS FOR MAGNETIC FIELD STABILIZATION IN A MRI SYSTEM

[75] Inventors: Rajendra Shenoy; David Hertz, both of Dix Hills; Terry Morrone, Greenlawn, all of N.Y.; Sudhir Moolky, Vancouver, Wash.

[73] Assignee: Fonar Corporation, Melville, N.Y.

[21] Appl. No.: 08/908,691

[22] Filed: Aug. 7, 1997

Related U.S. Application Data

[60] Provisional application No. 60/023,890, Aug. 13, 1996.

[51] Int. Cl.$^7$ .................................................. G01V 3/00
[52] U.S. Cl. ............................................ 324/320; 324/322
[58] Field of Search ................................. 324/318, 319, 324/320, 322, 300, 307, 309, 312, 314

[56] References Cited

U.S. PATENT DOCUMENTS

| | | | |
|---|---|---|---|
| 3,714,553 | 1/1973 | Keller | 324/319 |
| 4,110,681 | 8/1978 | Hofer et al. | |
| 4,644,473 | 2/1987 | Kojima et al. | |
| 4,684,889 | 8/1987 | Yamaguchi et al. | |
| 4,707,666 | 11/1987 | Pfeifer et al. | |
| 5,155,436 | 10/1992 | Suzuki et al. | 324/320 |
| 5,166,620 | 11/1992 | Panosh | |
| 5,227,728 | 7/1993 | Kaufman et al. | |
| 5,302,899 | 4/1994 | Schett et al. | |
| 5,432,826 | 7/1995 | Rieder | |
| 5,442,290 | 8/1995 | Crooks | 324/318 |

OTHER PUBLICATIONS

D.I. Hoult et al., "A Novel Field–Frequency Look for a Superconducting Spectrometer," Journal of Magnetic Resonance (1978) pp. 351–365.

J. Weis et al., "Magnetic Field Stabilizer For NMR Imaging Systems With Resistive Magnets" Rev. Sci. Instrum., vol. 58, No. 12, Dec. 1987 pp. 2256–2259.

*Primary Examiner*—Louis Arana
*Attorney, Agent, or Firm*—Lerner, David, Littenberg, Krumholz & Mentlik, LLP

[57] ABSTRACT

A method of stabilizing the static magnetic field in a magnetic resonance imaging (MRI) system applies a radio frequency pulse to a test sample within the static magnetic field and an NMR signal is acquired from the test sample. A characteristic of a signal indicative of the NMR signal, such as the area, phase or the sum of the differences of sampled values is ascertained. In addition, the number of recurring features, such as zero-crossings, of the signal indicative of the NMR signal can be determined and a correction signal is generated to adjust the static magnetic field via a set of correction coils driven by a signal derived from the number of recurring features and the value of the characteristic. Apparatus for stabilizing the static magnetic field is also disclosed.

70 Claims, 5 Drawing Sheets

METHOD AND APPARATUS FOR MAGNETIC FIELD STABILIZATION IN A MRI SYSTEM

CROSS-REFERENCE TO RELATED APPLICATION

This application claims the benefit of U.S. Provisional Patent Application Serial No. 60/023,890, filed on Aug. 13, 1996, the disclosure of which is incorporated herein by reference.

FIELD OF THE INVENTION

The present invention relates to the stabilization of the static magnetic field used in a magnetic resonance imaging (MRI) system, and more particularly to stabilizing the static magnetic field through the use of a control signal applied to a set of correction coils.

BACKGROUND OF THE INVENTION

Today, magnetic resonance imaging (or "MRI") is a widely used imaging technique for looking inside the human body without the need for X-rays or invasive surgery. Magnetic resonance imaging uses the phenomenon of nuclear magnetic resonance (or "NMR") in which radio signals generated from atomic nuclei subjected to a strong magnetic field are detected and used in forming images of bodily portions of the subject.

Nuclear magnetic resonance takes advantage of the fact that certain atomic nuclei having an odd number of protons and/or neutrons (such as hydrogen nuclei) have magnetic moments or "spins" which, in the presence of a strong magnetic field, tend to align themselves in the direction of the magnetic field. When the nuclei are exposed to radio waves with a certain frequency, known as the resonant or Larmor frequency, the vectors of the nuclei become displaced out of alignment with the magnetic field. After such displacement, the spins of the processing nuclei produce infinitesimal radio signals or magnetic resonance signals, also at the resonant or Larmor frequency. For example, when hydrogen nuclei are placed within a magnetic field of 10 kilogauss (1 tesla), they can be made to resonate at a Larmor frequency of 42.576 MHz. The spinning nuclei eventually drift back into alignment with the magnetic field and the magnetic resonance signal gradually decays.

With MRI, the properties of the acquired magnetic resonance signals from individual small volume elements or "voxels" within a larger subject are determined in order to generate a graphical or pictorial image representing individual voxels having different chemical and/or physical properties which can be displayed in contrasting shades or colors. Because the magnetic field and applied exciting radio frequency signal are usually applied to a large region of the subject, however, it is necessary to use further techniques for spatial encoding purposes, i.e., for identifying the NMR signals acquired from different volume elements to generate the MRI image for the larger region under study. Such techniques typically include the further application of gradient magnetic fields to make use of the property that nuclei in a stronger magnetic field will resonate at a higher frequency than nuclei in a weaker magnetic field. Using computer analysis, the acquired signals received in time (i.e., time-domain signals) can be converted into frequency-domain signals using Fourier transformation. The frequency-domain signals indicate signal strength as a function of frequency and therefore contain information about signal strength as a function of position. In other words, a signal at a given frequency must have come from nuclei in the region of the magnetic field with the corresponding field strength. Such spatial encoding techniques are well known to those skilled in the field of MRI and are beyond the scope of this disclosure.

The acquisition of MRI images is a complex process and requires high precision apparatus, which presents many difficulties and challenges to designers of MRI equipment. One difficulty that MRI designers face is maintaining the stability of the applied static magnetic field. Not only must the static magnetic field be strong for MRI acquisition, typically in the range of from 1 kilogauss to 15 kilogauss (1.5 tesla), but the field must also be precisely configured and uniform so as to be constant to preferably at least one part per million to provide acceptable images.

A major problem with keeping the static magnetic field constant occurs from the drifting of the magnetic field or disruptions to the field caused by external conditions and forces, such as temperature variations, power supply stability and aging of the components, in addition to the movement of ferromagnetic trains or subways, surges in power lines, elevators and underground garages. These and other similar disruptions can move or pull the static field away from its desired resonance value. This problem is especially prevalent in MRI systems which are employed in urban areas which also contain many such external factors (e.g., subways, trains, etc.) that can affect the static magnetic field.

Changes to the static magnetic field during the imaging process are problematic and can cause "ghosting," blurring and other artifacts in the acquired images or even totally destroy the imaging data acquired during an imaging session. With scan times typically lasting as long as 2 to 10 minutes, deviations in the static field which alter the acquired MRI data can not only cause great inconvenience to the patient and imaging personnel, but also results in additional expense (ultimately borne by the patient or healthcare provider) if the imaging procedure must be repeated. Accordingly, there is a great need to stabilize the static magnetic field in a MRI system.

Magnetic field stabilization methods have been used in the field of NMR spectroscopy for a number of years. One such method of stabilizing a magnetic field for an NMR spectrometer is disclosed in U.S. Pat. No. 4,110,681 to Hofer et al., which provides a lock system for maintaining and stabilizing the magnetic field at a constant strength. This patent discloses periodically pulsing a control sample to produce a series of free induction decay (FID) signals, the periods of which are determined and used to correct the magnetic field. Each FID signal is analyzed by measuring the time it takes for the signal to cross the zero axis a given number of times. This measured time is then compared to a predetermined time, and if the times differ, the current flowing through the field coils is varied in the direction tending to eliminate the difference. A significant problem, however, with the stabilization method of Hofer et al. is that there is a sacrifice in accuracy since the system only accounts for integer values of zero crossings in the FID signal. In other words, the correction technique loses accuracy when the sensed FID signal is not exactly in phase with the desired FID signal such that the magnetic field has drifted, but there are still the same number of zero crossings in the sensed FID signal. For example, a shift in the static magnetic field causing an 89 degree phase change in the sensed FID signal may not generate an additional zero crossing and hence no correction signal will be applied even though the static magnetic field has drifted.

In Hoult et al., "A Novel Field-Frequency Lock for a Superconducting Spectrometer," 30 J. Mag. Res., 351–65 (1978), ("Hoult"), the background of providing NMR spectrometers with some type of feedback system to account for variations of the magnetic field is described. Hoult describes prior systems that use the output voltage of a continuous-wave spectrometer when very close to resonance, which is proportional to the error in the resonance condition, as a feedback mechanism. Hoult discusses that a superconducting solenoid is less immune to external influences than traditional NMR spectrometer systems using permanent magnets.

Static magnetic field stabilization based on such NMR spectroscopy "lock" techniques have now been introduced in the field of MRI. Magnetic field stabilization based on NMR techniques uses the NMR signal from a separate fiducial or from a slice outside of the imaging volume. The usual imaging sequence is modified to first allow time for RF excitation of the sample (or slice) to obtain the NMR signal. The NMR signal following the RF excitation pulse is amplified and demodulated to obtain an audio or low frequency signal. The low frequency signal is integrated with an analog integrator and the integrated value is used as an input voltage to a programmable power supply to drive a set of correction coils placed within the imaging volume of the magnet to stabilize the magnetic field. When the magnet is locked, the above-described system pulls the magnetic field slightly away from the resonant frequency and the area of the of the low frequency signal (or nearly-zero beat signal) is zero. Whenever the magnet drifts from resonance, the integrated value becomes non-zero and the output of the integrator acts as a correction signal to the correction coils to pull the magnet back to its intended resonance value.

The implementation of NMR lock techniques to the field of MRJ, however, has been demonstrated to be problematic and impractical in clinical settings due to a number of problems. For instance, problems occur due to the use of the analog integrator which can introduce errors into the correction signal from the baseline drift of the integrator. These prior NMR lock techniques also lack sophistication in handling data in a number of situations, such as the inability to discard data in the event of a large magnetic field disturbance or drift, and the inability to even detect large magnitude magnetic field drifts. The prior techniques further experience problems when trying to pull the magnetic field back to the original resonance value after a large magnetic field disturbance.

Therefore, there exists the need for an improved method for stabilizing the static magnetic field in an MRI system which overcomes the problems associated with the aforementioned prior art methods and systems.

SUMMARY OF THE INVENTION

In a preferred embodiment, the present invention provides a method of stabilizing the static magnetic field in a magnetic resonance imaging (MRI) system comprising the steps of (a) applying an excitation pulse to a test sample disposed in the static magnetic field and acquiring a nuclear magnetic resonance (NMR) signal from the test sample; (b) determining a number of features observed in a signal indicative of the NMR signal during a first predetermined period of time; (c) ascertaining a value of a characteristic observed in a signal indicative of the NMR signal during a second predetermined period of time; and (d) applying a correction signal based on the number of the features and the value of the characteristic to adjust the static magnetic field until the NMR signal reaches a setpoint frequency at which the number of recurring features reaches a setpoint number and the value of the characteristic reaches a setpoint value.

Desirably, the features observed in the signal indicative of the NMR signal are recurring features, and more desirably comprise zero-crossings of the signal.

Preferably, the characteristic comprises signal area obtained by integrating the signal indicative of the NMR signal over the second predetermined period of time and said setpoint value comprises a desired signal area, and the preferred setpoint value is zero. Alternatively, the characteristic may comprise a phase value of the signal indicative of the NMR signal and the setpoint value comprises a desired phase value. Further, the characteristic could comprise a sum of differences value obtained by computing the sum of differences of sampled values of the signal indicative of the NMR signal and said setpoint value represents a desired sum of the differences of sampled values.

The method preferably further comprises the step of demodulating the acquired NMR signal with a reference signal to obtain a low frequency signal and the signal indicative of the NMR signal comprises the low frequency signal, which can be used to determine the characteristic of area, phase or the sum of differences.

Where phase value is used, the present invention desirably computes the phase value from the Fourier transform of the low frequency signal and the desired phase value is 180 degrees. The sum of the differences is preferably computed from the equation:

$$S = \sum_{i=0}^{N-1} |E_{i+1} - E_i|,$$

where S is the sum of differences, N is the number of sample points taken of the low frequency signal and E is the signal strength of the low frequency signal at the given sample value.

The method preferably includes determining a sign of the difference in frequency between the acquired NMR signal and the setpoint frequency after application of the correction signal and adjusting said correction signal based upon the sign of the difference. This can be accomplished by observing the change in the number of recurring features after the application of the correction signal.

The step of adjusting said correction signal may also include multiplying the correction signal by a direction constant to temporarily change the direction of the correction signal when the static magnetic field has moved further away from a desired value after the application of the correction signal such that subsequent application of an adjusted correction signal will move the static magnetic field to a nondesired value, and adding a jump signal to the correction signal to move the static magnetic field from the nondesired value to the desired value where the NMR signal reaches the setpoint frequency.

Alternatively, the acquired NMR signal can be demodulated with first and second reference signals having different frequencies to obtain first and second low frequency signals and the sign of the difference can be ascertained by determining the difference in the number of features present in the first and second low frequency signals.

Another alternative is to determine the sign of the difference by (i) computing the Fourier transform of the signal indicative of the NMR signal, (ii) computing the integral of a first component of the Fourier transform and the integral of a later occurring component of the Fourier transform, and (iii) determining the sign of the difference by comparing the difference between the integral of the first component with the integral the later occurring component of the Fourier transform, such as the 511th component.

The method of the present invention may utilize the characteristic comprising signal area obtained by digitizing the signal indicative of the NMR signal or low frequency signal with an analog-to-digital (A/D) converter to obtain a series of digitized signal values and integrating said digitized signal by summing the digitized signal values.

To calibrate the system, the method preferably includes the steps of (a) directing a calibration signal having a known average value to said A/D converter during a calibration period so that said calibration signal is digitized to yield a plurality of digitized calibration signal values and summing the digitized calibration signal values to yield an integrated calibration signal; (b) calculating an average system offset value from (i) said integrated calibration signal, (ii) the number of digitized calibration signal values summed to form the integrated calibration signal and (iii) the known average value of said calibration signal; and (c) adding the average system offset value to each digitized sample value of the signal indicative of the NMR signal provided by the A/D converter during the step of digitizing.

The A/D converter desirably comprises multi-bit signal output means for generating a multi-bit output signal indicative of the digitized sample value of the signal indicative of the NMR signal, with each multi-bit output signal including a plurality of bits ranging from a most significant bit to a least significant bit, and the step of adding the average offset value to each digitized sample value includes the step of concatenating a set of correction bits representing the average system offset value with the multi-bit offset signal to thereby form a composite offset-corrected signal. The concatenating step is performed so that in said composite offset-corrected signal, at least some of the correction bits are less significant than the least significant bit in the multi-bit output signal.

The method of the present invention may also include the step of setting a hysteresis value as a percentage of a maximum amplitude of the signal indicative of the NMR signal and disregarding recurring features if the recurring features are not associated with a transition between a maximum and a minimum of the signal indicative of the NMR signal which differ from one another by more than said hysteresis value. With this method, extraneous recurring features in the signal indicative of the NMR signal caused by noise or the like are filtered out and disregarded in the step of determining the number of recurring features.

The method of the present invention also desirably comprises the step of temporarily discarding acquired imaging information from the MRI system if the difference between the number of recurring features and the setpoint number is greater than a predetermined threshold value and/or if the difference between the value of the characteristic and the setpoint value is greater than a predetermined threshold value.

Preferably, the first and second predetermined periods of time used in determining the recurring features and value of the characteristic are the same, and the recurring features comprise zero-crossings of the low frequency signal.

In another aspect of the present invention, apparatus is provided for stabilizing the static magnetic field in a magnetic resonance imaging (MRI) system, comprising: (a) means for applying an excitation pulse to a test sample disposed in the static magnetic field and means for acquiring a nuclear magnetic resonance (NMR) signal from the test sample; (b) means for determining a number of features observed in a signal indicative of the NMR signal during a first predetermined period of time; (c) means for ascertaining a value of a characteristic observed in a signal indicative of the NMR signal during a second predetermined period of time; (d) means for generating a correction signal based on the number of features and the value of the characteristic; (e) means for adjusting the static magnetic field based on the correction signal; and (f) means for applying the correction signal to said means for adjusting until the NMR signal reaches a setpoint frequency at which the number of features reaches a setpoint number and the value of the characteristic reaches a setpoint value.

Preferably, the features observed in the signal indicative of the NMR signal are recurring, and more preferably comprise zero-crossings of the signal. Desirably, the means for adjusting the static magnetic field include one or more static field correction coils driven by a programmable power supply. The static field correction coils can be located within or outside of an imaging volume disposed within the static magnetic field.

The test sample is desirably disposed outside of the imaging volume and may consist of a fiducial slice of an object containing a region of interest to be imaged or a fiducial object independent of an object to be imaged.

Preferably, the test sample, which can consist of fluorine, has resonant frequency different from the resonant frequency of the object to be imaged.

As with the methods described above, apparatus in accordance with the present invention can include means for integrating the signal indicative of the NMR signal to obtain a desired signal area, means for determining a phase value of the signal indicative of the NMR signal, and means for computing a sum of differences value obtained by computing the sum of differences of sampled values of the signal indicative of the NMR signal.

Likewise, means for adjusting the correction signal are desirably provided and include means for multiplying the correction signal by a direction constant to temporarily change the direction of the correction signal when the static magnetic field has moved further away from a desired value after the application of the correction signal such that subsequent application of an adjusted correction signal will move the static magnetic field to a nondesired value, and means for adding a jump signal to the correction signal to move the static magnetic field from the nondesired value to the desired value where the NMR signal reaches the setpoint frequency.

Means are also preferably provided for determining the sign of the difference from the Fourier transform of the signal indicative of the NMR signal.

Apparatus in accordance with the present invention desirably include (a) means for directing a calibration signal having a known average value to the A/D converter during a calibration period so that the calibration signal is digitized to yield a plurality of digitized calibration signal values and summing the digitized calibration signal values to yield an integrated calibration signal; means for calculating an average system offset value from (i) the integrated calibration signal, (ii) the number of digitized calibration signal values summed to form the integrated calibration signal and (iii) the known average value of the calibration signal; and (c) means for adding the average system offset value to each digitized sample value of the signal indicative of the NMR signal provided by said A/D converter during the step of digitizing.

The foregoing and other objects, features and advantages of the present invention will be more readily apparent from the detailed description of the preferred embodiments set forth below, taken in conjunction with the accompanying drawings.

DETAILED DESCRIPTION OF PREFERRED EMBODIMENTS

Figure 1:
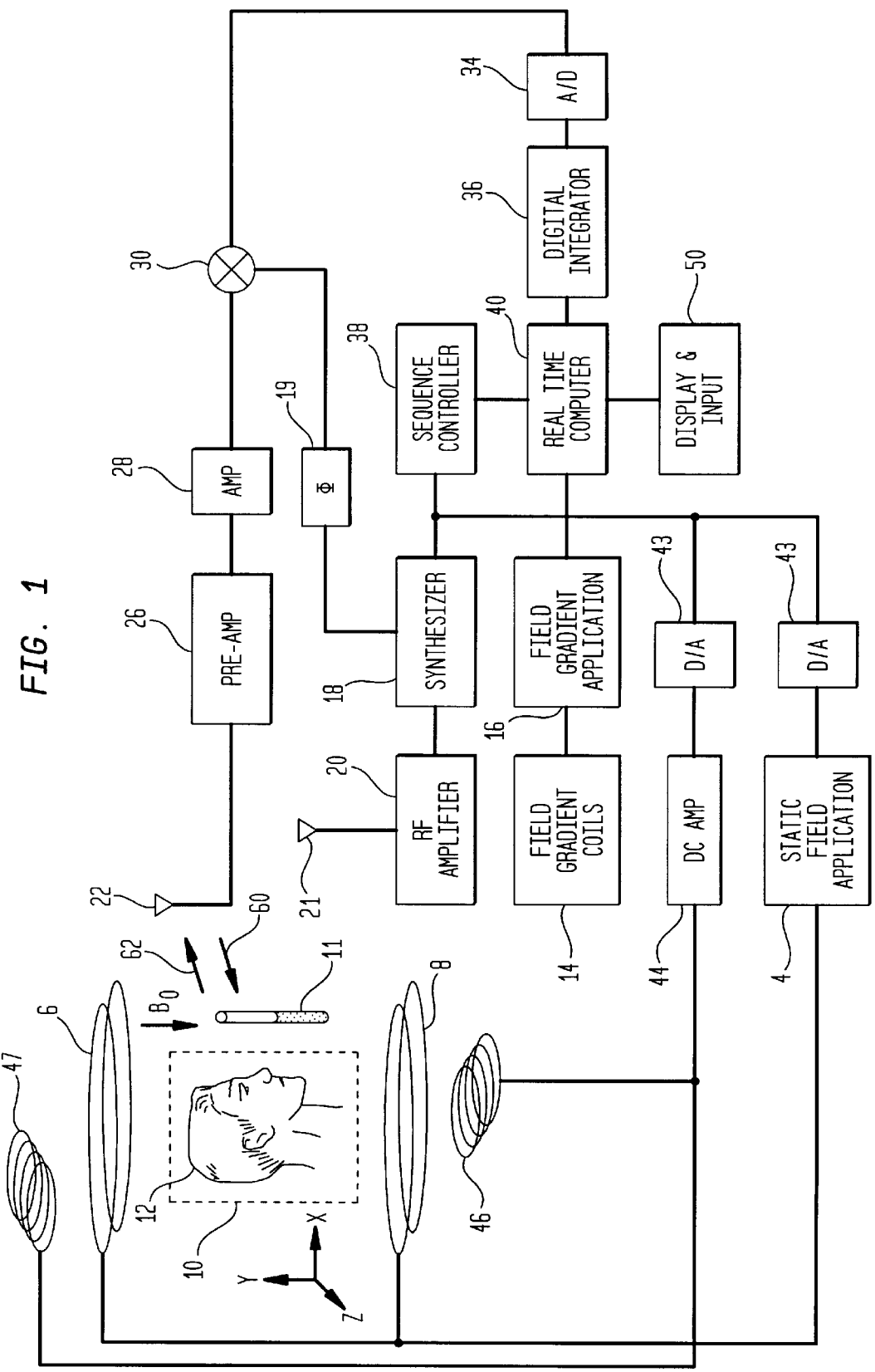
FIG. 1 is a schematic diagram of the basic components of the static field stabilization system in accordance with the present invention.

Referring to FIG. 1, there is shown a schematic diagram of the main components of a preferred apparatus used to implement one aspect of the magnetic field stabilization technique of the present invention, added to an existing MRI apparatus. Such an MRI apparatus includes a static magnetic field application unit 4 which incorporates a large magnet schematically represented by static field generating coils 6 and 8. Coils 6 and 8 define therebetween a patient receiving volume 10 and the coils 6 and 8 are adapted to apply a substantially uniform static magnetic field $B_0$ within volume 10. Volume 10 is preferably large enough to receive at least a portion of the human body 12, such as the head, torso, arm, leg, etc. of a typical human subject. While the static magnetic field $B_0$ is shown as being applied by electromagnetic coils, a permanent magnet or superconducting magnet can also be used to generate the static magnetic field. A fiducial sample 11 used for static field stabilization in accordance with the present invention (as discussed in detail below) is preferably provided outside of the patient receiving volume but still subject to the static magnetic field $B_0$ generated by the static field coils 6 and 8.

The MRI apparatus further includes magnetic field gradient coils shown schematically as 14. Typically, three sets of coils are provided and are mounted adjacent the patient receiving volume 10, arranged on different geometric axes. A field gradient application unit 16 is employed for selectively energizing the various sets of gradient coils to impose magnetic field gradients or variations in the magnetic field $B_0$ on any one or more of the three coordinate axes X, Y and Z. Field gradients can also be provided in directions oblique to these axes by applying gradients on two or more axes simultaneously.

The MRI apparatus also includes a radio frequency synthesizer 18 and a radio-frequency amplifier 20. Connected to radio-frequency amplifier 20 is a transmitter coil 21. An RF antenna 22 is disposed adjacent patient receiving volume 10 for receiving radio-frequency (RF) electromagnetic radiation signals 60 sent from the fiducial sample 11. A separate small transmitter coil can be used to excite only the fiducial sample.

The received NMR signal from fiducial sample 11 is first amplified through a preamplifier 26 and amplifier stage 28 and is then provided to demodulator 30, to which a radio-frequency source (such as synthesizer 18 and RF amplifier 20) is also supplied. Preferably, if necessary, a phase adjustment can be applied to the output signal from the synthesizer at phase adjuster unit 19. The output signal from demodulator 30 is a low frequency ("LF") signal. The demodulator 30 may comprise either a digital or analog demodulator. The LF signal produced is in the form of electrical voltages and is typically an audio-frequency signal in the range of 0 to 100 kHz. The LF signal can also be specified as a digital signal comprising a set of numbers representative of the analog signal.

The output signal from demodulator 30 is then digitized by analog-to-digital (A/D) converter 34 and the resultant digital signal is introduced to digital integrator unit 36. The results of the integration are stored in a memory buffer (as explained in more detail below) and are subsequently used by real-time computer 40, which comprises a high performance microprocessor running under a real-time operating system. Computer 40 generates an output control signal which is converted to analog form via D/A converter 43 and is fed to DC amplifier 44 (preferably a programmable power supply) which in turn drives a set of correction coils 46 and 47 used to adjust or correct the static magnetic field in accordance with the present invention. Sequence controller 38 is also provided to control the events of the MRI system which are not controllable by a real-time computer such as with timing sequences which are on the order of nanoseconds.

The imaging apparatus may further include a display and input unit 50 for accepting user input and displaying the computed MR image in readable form such as a pictorial display. Display and input unit 50 may also provide image output appropriate printing and storage devices (not shown).

Other basic components of an MRI apparatus which have been omitted are conventional and well-known, and will not be described in detail in this disclosure. For example, suitable MRI units that can be used in accordance with the present invention include those sold commercially under the trademarks FONAR, BETA 3000, BETA 3000M, ULTIMATE Series and QUAD Series by Fonar Corporation of Melville, N.Y. In addition, other commercially manufactured scanners can be utilized with the present invention.

Figure 2A:
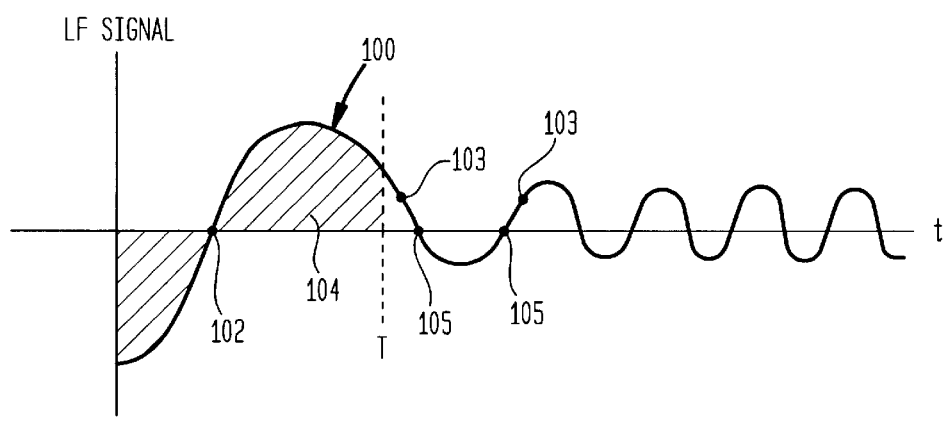
FIG. 2A is a graphical representation of the low frequency signal versus time.

The manner in which the static magnetic field is stabilized in accordance with a preferred embodiment of the present invention using area evaluation and zero-crossing detection is as follows and can be better understood by reference to FIG. 1 and the graphs of FIGS. 2A and 2B as well as FIGS. 3A to 3J.

First, prior to imaging of the patient, the uniform static field $B_0$ is generated from field coils 6 and 8 and a fiducial sample 11 is located within the static magnetic field. The fiducial sample 11 is preferably located outside of the patient receiving volume 10 so as not to interfere with the subsequent imaging of the patient. The fiducial sample 11 preferably comprises a sample containing fluorine or other similar material having well-known NMR characteristics. Fluorine is also preferred since it gives the strongest NMR signal next to hydrogen (having a single proton nucleus) and its resonance frequency at 0.6 tesla is about 1.484 MHz less than hydrogen's resonance frequency ($\gamma_{FLUORINE}$=4005 Hz/gauss and $\gamma_H$=4257 Hz/gauss). Thus, the large difference in frequency prevents the fiducial NMR signal and the imaging signal from interfering with each other. Of course, it should be appreciated that other fiducial samples can be used such as Deuterium. Moreover, a portion or "slice" of the patient 12 outside of the patient imaging area can also be used instead of the fiducial sample 11.

Prior to the imaging of the patient, a radio-frequency pulse 60 with sufficient bandwidth to contain any anticipated drift of the Larmor frequency of the fiducial sample 11 is applied to the fiducial sample subject to the static magnetic field and an NMR signal 62 is generated from the sample. At resonance, the Larmor frequency or the acquired NMR signal is the same as the applied RF signal. Variations in the static magnetic field, however, will cause frequency changes in the acquired signal and such variations are detected and used by the present invention in order to stabilize the static magnetic field.

Once the NMR signal from the fiducial sample is obtained at RF antenna 22, it is amplified and combined at demodulator 30 with an RF carrier signal to obtain a low frequency ("LF") signal which is more easily analyzed for field correction, since the actual frequencies of the acquired NMR signal and applied RF signal are in the MHz range and are more difficult to directly process. The LF signal, shown graphically in FIG. 2A, is a sinusoidal wave form (a cosine wave) with an exponential decay in the general form:

$$\text{LF signal} = \cos(\gamma B_0 - \omega) t \bullet e^{-\alpha t}$$

where $\gamma B_0$ represents the applied Larmor frequency, $\omega$, is the reference frequency used to demodulate the NMR signal from the fiducial sample and $\alpha$ is determined by T2 and T2* decay.

Once the LF signal is obtained, a characteristic of the LF signal can be determined for use in generating a correction signal. One preferred characteristic obtained from the LF signal (or a signal indicative of the acquired NMR signal) is signal area over a predetermined time period. To this end, the LF signal can be integrated over a first predetermined time period T. The first predetermined time period T is preferably set to that time period which yields a zero area of the LF signal (shaded area 104) with one zero-crossing of the LF signal when the fiducial sample is at resonance and the static magnetic field is at its desired resonance value or at a value which is nearly at resonance. The zero area of the LF signal over the time period T is then preferably chosen as a desired "setpoint value" of the area of the LF signal. Of course, other desired setpoint values of area can be chosen such that the desired area is some predetermined non-zero number.

In addition to integrating the LF signal over the predetermined time period T, a number of "features" are counted in the LF signal during a second time period which preferably is the same period as the first predetermined period. These features are preferably features which are recurring in the LF signal, such as zero-crossings. Alternatively, the number of recurring features can be determined from a signal representing the area or integral of the LF signal in the case where the LF signal itself is too noisy and integrating the LF signal can reduce or cancel unwanted noise to produce a more accurate count of recurring features. The number of recurring features in the LF signal (or LF area signal) will then be compared to a predetermined number of recurring features or a "setpoint number." As shown in FIG. 2A, the recurring features may consist of zero-axis crossings of the LF signal, such as zero-crossing 102 and 105 of the LF signal 100, and the setpoint number is preferably one (i.e., one zero-crossing is desired). It should be appreciated, however, that instead of zero-crossings, other recurring values in the LF signal could be used, such as recurring non-zero values 103.

Using both the integrated value of the LF signal and the determined number of recurring features in the LF signal, the control and power supply unit 40 generates a correction signal with a magnitude based on (a) the difference between the measured LF signal area and the setpoint value (the desired area), and (b) the difference between the determined number of recurring features and the setpoint number (the desired number of recurring features). The correction signal is then applied to DC amplifier 44 which in turn drives the set of correction coils 46 to adjust the magnetic field until the NMR signal reaches the setpoint frequency (preferably the Larmor frequency of the fiducial sample) at which the signal area reaches the setpoint value and the number of recurring features reaches the setpoint number. Preferably, as a result of the application of the correction signal, the LF signal is returned to a state in which there is one zero-axis crossing and with a zero area over time T.

An important advantage of the magnetic field stabilization system of the present invention lies in its ability not only to correct minor deviations in the magnetic field by basing the correction signal on the integrated area of the LF signal, but also to quickly correct for quite large deviations in the magnetic field and in instances where the low frequency signal may still have a zero area but the magnetic field is still not at its desired resonant value.

For instance, a large deviation in the magnetic field can lead to situations where slight correction of the static magnetic field will return the integrated area to its desired setpoint value (such as zero area) but the static magnetic field will nevertheless not be at resonance. Thus, with recurring feature (or zero-crossing) detection, however, an undesired number of recurring features indicates that the static magnetic field is not at resonance and that further adjustment to the static magnetic field is required. With the present invention, relatively large deviations (e.g., many zero-crossings as opposed to one zero-crossing) in the static magnetic field can therefore be accounted for and quickly corrected whereas in traditional feedback loop systems, such large deviations are simply not correctable.

Figure 2B:
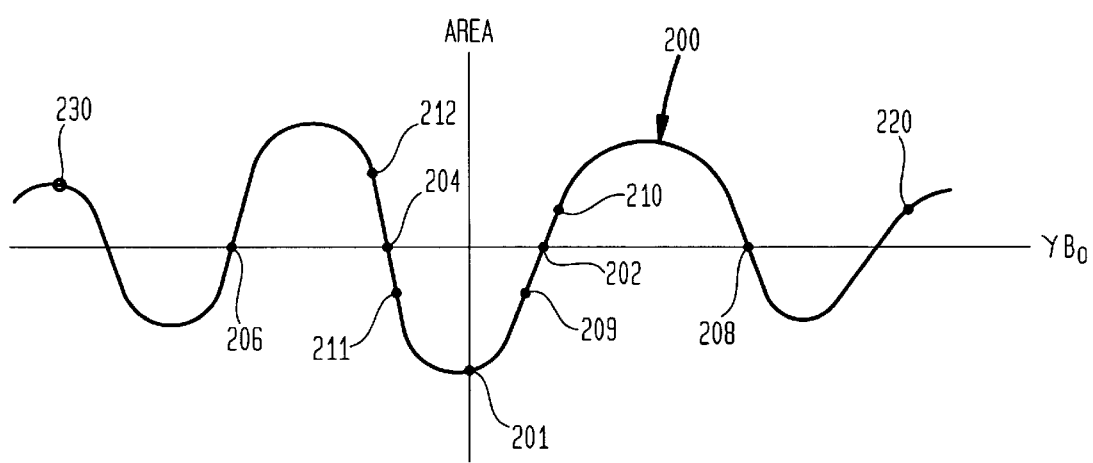
FIG. 2B is a graphical representation of the area of the low frequency signal over a predetermined time period versus the frequency of the acquired NMR signal.

Referring now to FIG. 2B, there is shown a plot of a signal 200 representing the area of the LF signal 100 (from zero to time T) versus the frequency ($\omega$) of the NMR signal, defined by the equation $\omega = \gamma B_0$, where $\gamma$ represents the gryomagnetic ratio of the fiducial sample (a constant that varies for each atomic nuclei) and $B_0$ represents the static magnetic field strength. The plot of the area versus frequency (which is in turn is proportional to change in the static magnetic field) is a sinusoidal waveform 200 and includes a number of zero-area states such as states 202, 204, 206, 208, etc. Preferably, zero-area state 202 is chosen as the "desired" zero-area state where the magnetic field is at its desired resonance value. Namely, in a preferred setting at the desired zero-area state 202, the area of the LF signal over time T is zero and, there is only one zero-crossing (102) in the LF signal over time T.

When the integrated value of the LF signal is zero (i.e., zero area), the number of zero crossings detected in the LF signal provides indication of whether the system is at the desired zero-area state 202. For instance, if there are two zero-crossings in the LF signal, there are two possible zero-area states that the system could be at, i.e., either zero-area state 206 or zero-area state 208, depending on the sign of the frequency difference between the applied RF pulse 60 and the acquired NMR signal 62. The system must therefore determine which one of these two states is present, since the subsequently generated correction signal will depend on whether the targeted zero-area state is only one state away from desired zero area state 202 (i.e., at state 208) or two states away (i.e., at state 206). Thus, a correction is applied proportional to the number of zero-crossings. If the number of zero-crossings increases as a result of the correction, the sign of the correction was incorrect, revealing the true position above or below resonance and appropriate adjustment is made as described below.

More specifically, to make corrections to the static magnetic field by varying the correction signal, the present invention, in one preferred embodiment, uses an area constant, a beat constant and a direction constant The "area constant" is a constant number which is multiplied by the measured area of the LF signal over time T in order to provide the proper scaled input voltage to DC amplifier 44 which applies the correction voltage to the correction coils. In order to correct for potential nonlinearities, the area constant may become a function of area. In this case, a look-up table can be created consisting of measured values of area as a function of known changes in the field. The "beat constant" is a constant multiplied by the number of beats or zero-crossings detected in the LF signal over time T. Finally, the "direction constant" has a value of either +1 or −1 and is used to multiply the beat constant (to change its sign) and area constant depending on where on the area versus $\gamma B_0$ graph the system is at.

The stabilization of the magnetic field according to the present invention, using both "area correction" (fine correction) and "beat correction" (coarse correction) is as follows.

Referring to FIG. 2B, at resonance (or near-resonance), the magnet is at point 201 on curve 200. When the correction system is activated, the magnet could lock either at point 202 or at point 204. The preference of the system to lock at either point depends on (1) the sign of the area constant, (2) the sign of the direction constant, and (3) the polarity of the current in the correction coils 46. The area correction equation is as follows:

Area Correction=Area * Area constant * Direction constant.

As an example, the sign of the direction constant and the lock constant can be chosen in such a way that the magnet locks to state 202 (i.e., area constant positive and direction constant negative). Once the magnet is locked to state 202, it is desired to lock the magnet to this state all the time. For example, when the magnet drifts slightly away from state 202 to state 209, the area is negative, which when multiplied by a negative direction constant, produces a positive area correction such that the magnet is moved back to state 202. Likewise, when the magnet drifts to state 210, the area is positive, which when multiplied by a negative direction constant, produces a negative area correction such that the magnet is moved back to state 202.

When the magnet drifts to the opposite side of 201 towards point 211, the area is negative, which produces a positive area correction to thereby push the magnet past point 201 toward state 202. However, when the magnet drifts to state 212, the area is positive, the area correction is negative and the magnet is pushed towards point 206, which is not the desired location since the LF signal has a number of unwanted beats. If this occurs, the beat correction is operative to return the magnet back to its desired state 202 as discussed below.

With beat correction, coarse adjustments to the magnet can be made when there are a number of undesired zero-crossings. Whenever the magnet drifts far away from resonance, the LF signal displays a number of beats or zero-crossings. The beat correction software counts the number of zero-crossings in the first predetermined period T and a correction current is applied to coils 46. The beat correction is given by the relation:

Beat correction=Number of zero-crossings * Beat constant * Direction constant.

The sign of the beat constant is the same as the area constant.

If the magnet now drifts to state 220, the beat correction software detects a number of zero-crossings and applies a negative correction signal. If the number of beats detected in the LF signal is lower that the previous measurement, the correction is taking place in the proper direction and the beat correction continues until the number of beats is reduced to only one, at which time the area correction becomes the dominant correction method to lock the magnet to state 202.

When the magnet drifts to the opposite side towards state 230, the beat correction increases the number of zero-crossings instead of decreasing it. At this point, the correction software switches the sign of the direction constant to +1 such that the applied correction signal moves the magnetic field towards state 204. At this time, the LF signal has only one zero crossing and the area could be positive if it is close to 212, or negative if it is close to 211. If it is negative, then the area lock will push it toward 202, and lock on 202 as explained earlier. If it is close to 212, the area is positive, and the area correction moves the magnet away toward 230. Therefore, the signal will get tossed back and forth between beats and zero area and will (in most cases) never stabilize. To overcome this unstable situation, when the number of beats is one or less, the software forces two zero-crossings into the correction calculation so that the magnet is then returned to the opposite side of resonance point 201 and closer to point 202, and the sign of the direction constant is switched back to −1. At this stage, as before, the area correction dominates and the magnet is then locked onto state 202.

When the magnet is brought back to the desired state following a beat correction, the collection of imaging data is not started immediately, as the magnet is first allowed to settle down before resuming data acquisition. Typically, the data collection can be disabled for an additional 5–10 TR intervals. These are called steady-state repetitions. While this may seem unnecessary because disabling data acquisition in a slice disables the whole TR such that one automatically gets some grace time. However, if the correction ends on the last slice of the TR, the steady state repetitions are needed in the next TR.

The above beat correction is accomplished where only a single frequency of demodulation is used to demodulated the detected NMR signal. However, as described below, an alternate beat correction method can be used wherein more than one demodulation frequency is employed.

In order to determine the change in direction of the magnetic field to apply the appropriate coarse or beat correction, another preferred embodiment makes use of two or more demodulation frequencies to mix with the acquired NMR signal. Preferably, two demodulation frequencies are used where the first frequency is at the Larmor frequency, $f_{(L)}$, while the second frequency is slightly higher or lower, but at a known value or offset from the first frequency. The second frequency may be as close as one component away from the first (i.e., $1/T_{observation}$). By counting the zero-crossings of the first demodulated signal and the second demodulated signal over the same predetermined period of time, one can determine the direction of change in the magnetic field.

Figure 3A:
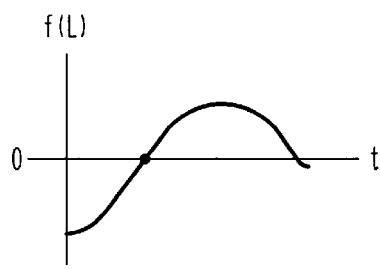
FIGS. 3A–3J are graphical representations of the low frequency signal at two demodulation frequencies at various states of magnet drift.
Figure 3B:
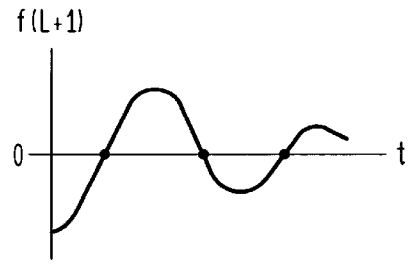
Figure 3C:
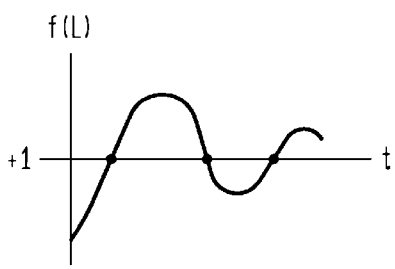
Figure 3D:
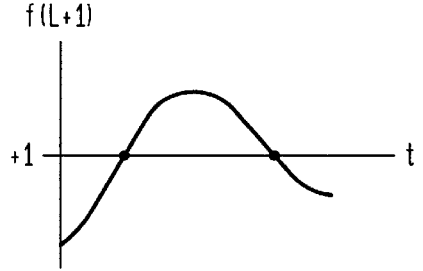
Figure 3E:
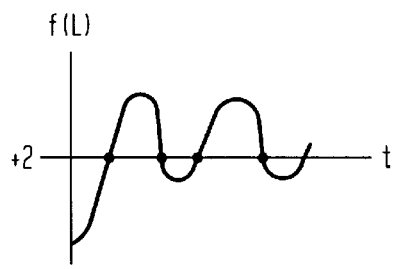
Figure 3F:
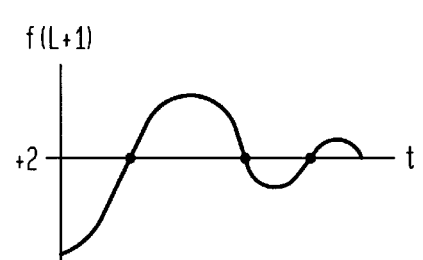
Figure 3G:
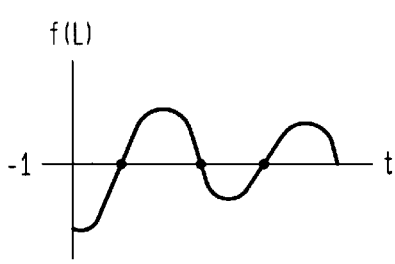
Figure 3H:
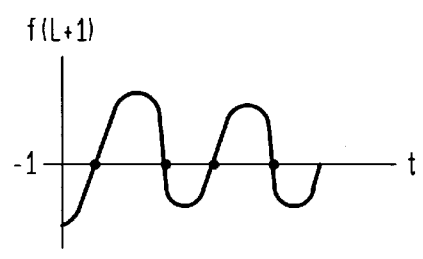
Figure 3I:
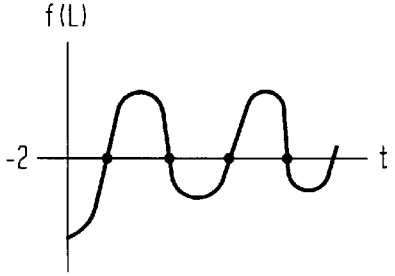
Figure 3J:
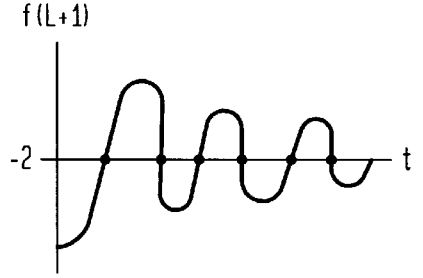

FIGS. 3A to 3J show the operation the dual frequency beat correction. Plotted on the left side graphs (FIGS. 3A, 3C, 3E, 3G, 3I) are the demodulated waveforms at the Larmor frequency $f_{(L)}$ while plotted at the right side graphs are the demodulated waveforms at an offset frequency $f_{L+1}$). At FIG. 3A, the waveform is at resonance (one zero-crossing) and the offset frequency at FIG. 3B shows multiple zero-crossings. At FIG. 3C, where the magnet has moved in one direction (say in the positive direction indicated by +1), the waveform shows more zero-crossings than the number of zero-crossings at FIG. 3D. Similarly, where the magnet has moved in a positive direction by an additional amount (+2), the waveform at FIG. 3E has more zero-crossings than the waveform at FIG. 3F. By contrast, when the magnet drifts to a lower value (−1), the waveform at FIG. 3G has less zero-crossings than the waveform at FIG. 3H. The same is true when the magnet drifts even lower (−2) where the waveform at FIG. 3I has less zero-crossings than at FIG. 3J. By knowing the number of zero-crossings in both demodulated signals, the direction of the drift of the field is determined and the appropriate sign correction signal is applied to return the magnet back to one zero-crossing where area correction will then take over.

In summary, the current applied to the correction coils is given by the equation:

Correction Current=Previous Correction Current+Beat Correction+ Area Correction.

It should be noted that the addition of the new correction signal to the previous signal can be accomplished though direct addition, or in a number of different ways to ensure smoothness or prevent overshoot, such as by the addition of a percentage (such as 90%) of the calculated correction to the previous correction or by adding the full correction signal to the moving average of a number of previous correction signals. In addition, it should be appreciated that instead of adjusting the static magnetic field to a desired value, the frequency of the excitation pulse can be varied to match the current value of the static field.

Figure 4:
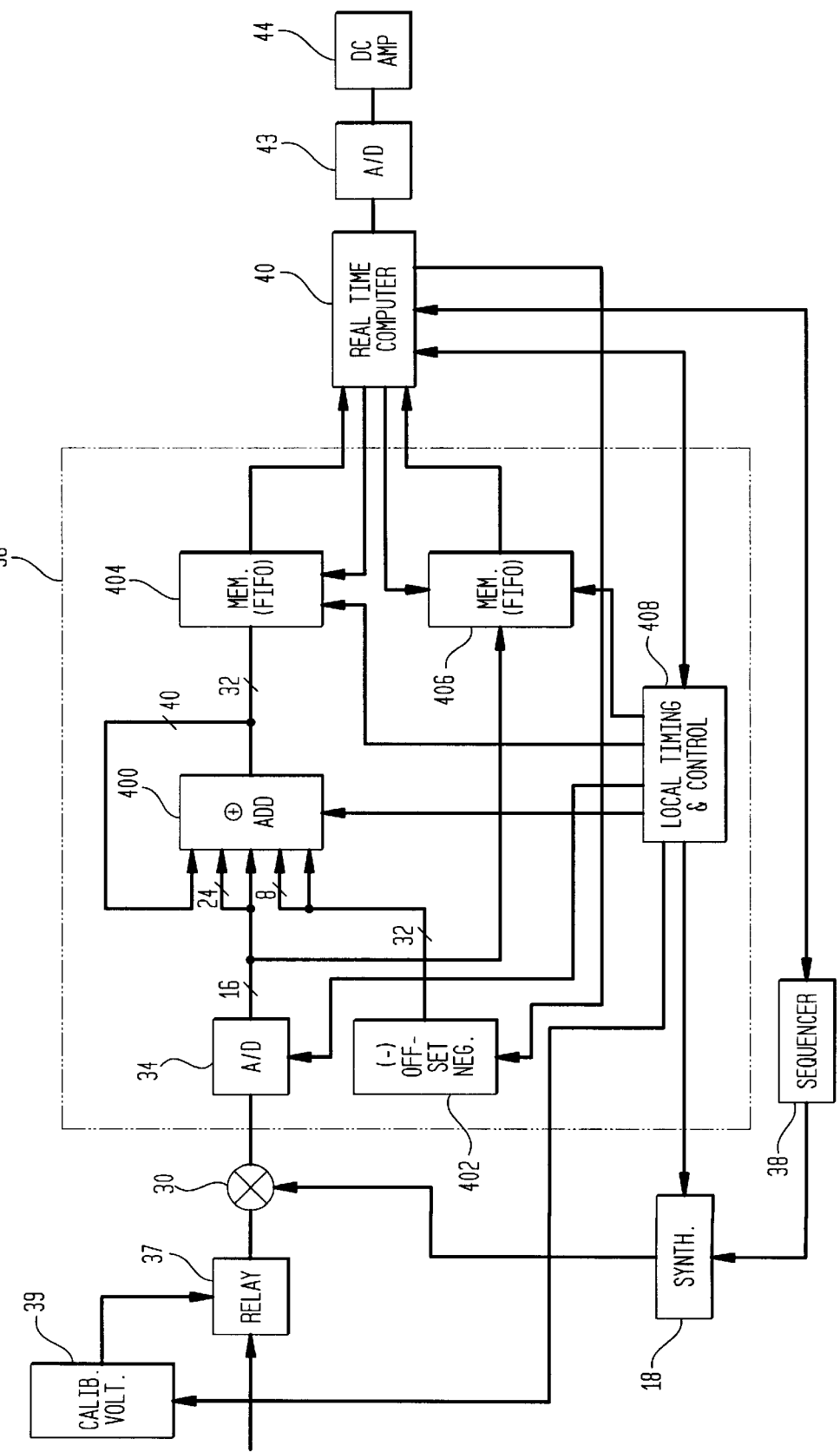
FIG. 4 is a block diagram of the preferred digital integrator used in accordance with the present invention.

Referring now to FIG. 4, the integration of the LF signal is preferably accomplished by using a digital integrator 36 which is shown in block diagram form and interfaces with some of the components previously described in FIG. 1, including synthesizer 18, mixer 30, A/D converter 34, sequence 38 and real-time computer 40. In operation, after the low frequency signal is observed for the first predetermined time period, relay 37 opens to introduce a calibration signal from calibration voltage unit 39. The calibration signal is then mixed with the signal from synthesizer and the resultant mixed or demodulated calibration signal is introduced to A/D converter 34 which is a 16 bit device. The output of A/D converter 34 (16 bits) plus an additional 24 bits of fine extension bits are then fed to adder 400 which is a 40 bit device. In addition, offset register 402 supplies 32 bits plus 8 extension bits (totaling 40 bits) which are likewise input to adder 400 for correction of system offset. The full 40 bit signal is fed back to adder 400 for accumulation. The output (only 32 bits) of adder 400 representing the area of the LF signal is then introduced to buffer (FIFO) memory 404 which is used for stabilization of the magnet, along with the number of zero-crossings stored in buffer (FIFO) memory 406. The timing and control of the components of the digital integrator are controlled by local timing and control unit 408.

Digital integrator 36 preferably employs a self-offset calibration technique that renders the integrator virtually drift-free as compared to analog integrators in which baseline drift typically occurs. In operation, the low frequency signal is digitized by A/D converter 34 to obtain a series of digitized signal values. The digitized low frequency signal is then integrated by summing the digitized signal values to obtain the signal area over the first predetermined period of time T. To account for any signal offset before the digital integrator (i.e., from the A/D converters, mixer and other components), the calibration signal having a known average value is first directed to the A/D converter 34 during the calibration period. The calibration signal is first digitized by the A/D converter to produce a plurality of digitized calibration signal values which are then summed to yield an integrated calibration signal. Next, an average offset value of the A/D converted signal is calculated and supplied to offset calibration register 402. The average offset value is based on (1) the integrated calibration signal, (2) the number of digitized calibration signal values summed to form the integrated calibration signal, and (3) the known average value of the calibration signal. The determined average offset value is then added (or subtracted) to each digitized sample value of the low frequency signal provided by said A/D converter during the digitizing of the low frequency signal to automatically correct for any offset in the system. When outputting the calculated area to memory 404, only 32 bits of the signal (the most significant bits) are used. Of course, more or less than 8 offset bits can be used for offset correction and more bits can be used in the area output signal by increasing the bit sizes of the digital components.

Preferably, the calibration signal used is an AC signal having the same average value as the LF signal in the first period and instead of comprising a separate calibration signal, may consist of a portion of the acquired LF signal after the first predetermined period, i.e., the periodic signal generated after the NMR pulse is introduced to the sample and detected.. The calibration period is desirably substantially larger than the period of the AC signal, and preferably at least about 10 times the period of the AC signal.

A further aspect of the present invention incorporates an automatic "hysteresis" determination whereby undesired or extraneous recurring features that appear in the low frequency signal are automatically disregarded. To accomplish this task, a hysteresis value can be set as a percentage of a maximum amplitude of the low frequency signal. With this hysteresis value set, and stored in the computer recurring features such as zero-crossings are disregarded in the calculations if they are associated with a transition between a maximum and a minimum of the low frequency signal which differ from one another by less than the hysteresis value. In this manner, extraneous recurring features, such as extraneous zero-crossings, in the low frequency signal caused by noise or the like are essentially filtered out of the low frequency signal and disregarded when determining the number of recurring features.

Figure 5:
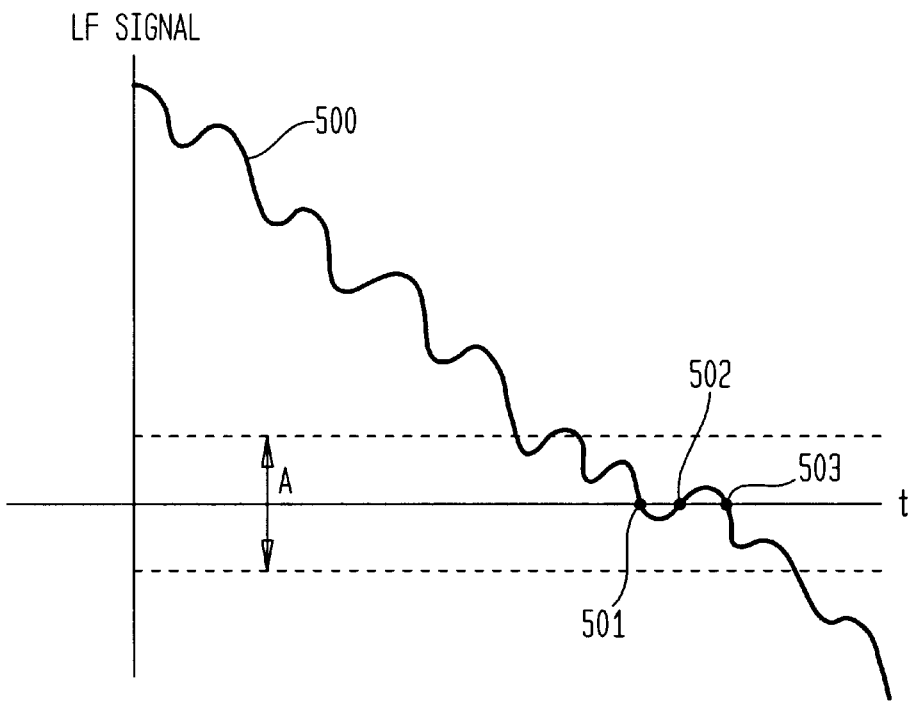
FIG. 5 is an enlarged portion of the graphical representation of the low frequency signal versus time showing the occurrence of extraneous recurring features present in the low frequency signal.
Figure 6:
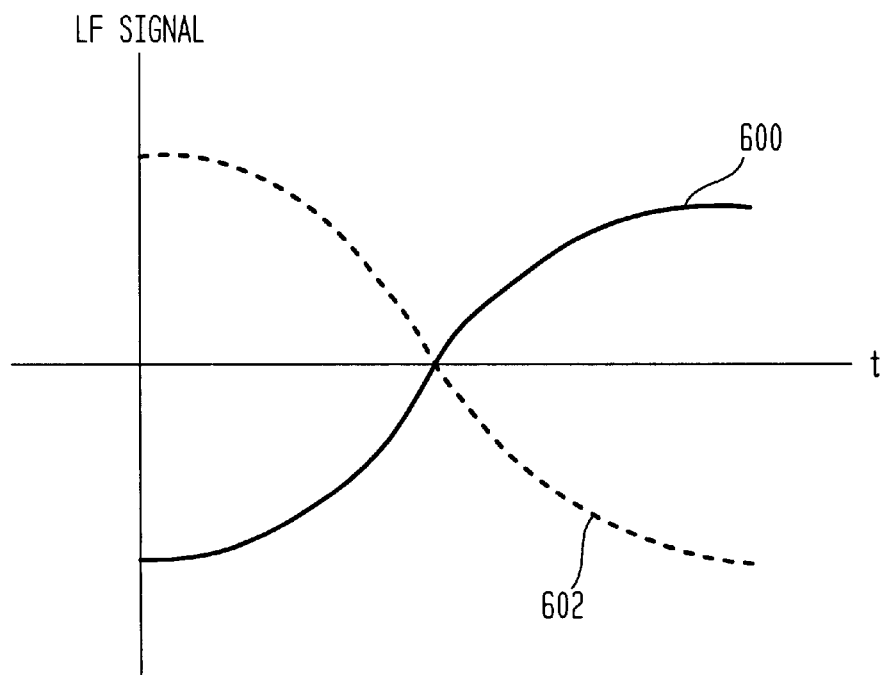
FIG. 6 is a graphical representation of two possible states of the low frequency signal versus time.

For example, referring now to FIG. 5, an enlarged portion of the LF signal 500 is shown which can be noisy and therefore produce more than one zero-crossing such as zero-crossings 501, 502 and 503. In order to discount the extraneous number of zero-crossings (such as crossings 502 and 503), a hysteresis value A can be set such that extra zero-crossing which occur within the hysteresis value A are ignored or discounted. Preferably, the hysterisis value is set to be 8 percent of the maximum signal amplitude of the LF signal. More preferably, because the amplitude of the LF signal will fluctuate significantly as the static field approaches and recedes from resonance, the maximum value of the LF signal is determined every acquisition and thus new hystersis values are continually re-calculated.

An important aspect of the present invention is that it helps prevent "ghosting" of the images caused by changes to the static magnetic field during the image acquisition procedure. Thus, to prevent image ghosting, the image information acquired during the time period in which the lock signal waveform has more than one zero-crossing or the area deviation is greater than a certain threshold value is discarded.

In operation, the normal MRI sequence is modified such that multiple and periodic time periods are set aside during the scanning procedure for the correction sequence to allow for excitation and sampling of the NMR signal from the fiducial sample. For instance, where both (a) TR and (b) the time it takes to excite the nuclei and obtain an echo for a single slice in a single TR period (hereinafter "TS") are long, the correction sequence can be run with every slice taken. However, if TS and TR are short, the correction sequence can be run every other slice or after a predetermined number of slices are taken. Thus, for example, for a T2 weighted scan with a 110 ms slice time, with a TR of 3 seconds, the correction sequence can be implemented with every slice. Scan time can also be lengthened to accommodate more frequent correction. Thus, although scan time may increase due to the performance of the correction sequence, this is far better than image ghosting or having to completely re-scan the patient.

Although the preferred embodiment of the present invention employs both area evaluation of the LF signal and zero-crossing detection of the LF signal, the phase characteristics of the LF signal can be used instead of the area. Namely, adjustment of the static field via correction coils can be based upon the measured phase value of the LF signal. In this manner, the Fourier transform or fast Fourier transform ("FFT") of the LF signal can be computed via computer 40 and the phase of such signal can be determined therefrom. The phase of the signal will be a number between 0° and 360°. Corrections to the static field can then be made through the field correction coils in order to drive the phase to a setpoint phase value, which is preferably 180°. The use of the phase of the LF signal instead of the area can be combined with an evaluation of the number of zero-crossings, and such a combination is also capable of recovering from large deviations in the static magnetic field. The use of area of the LF signal instead of phase is generally preferred, however, because it is easier and faster to compute. However, with the cost of processing power ever decreasing, calculating the FFT to determine phase of the LF signal can also be a practical and cost-effective alternative.

Yet a further aspect of the present invention makes use of the differences of sample values of the LF signal rather than measuring the area or phase of the LF signal. In this manner, a "difference lock" technique operates as follows. For the LF signal, rather than computing area over the predetermined period of time, the sum of the absolute value of the differences are computed by control unit 40 for the signal sampled at N points as follows:

$$S = \sum_{i=0}^{N-1} |E_{i+1} - E_i|$$

where S represents the sum of the differences, N is the number of sample points taken from the LF signal, and E is the signal strength of the LF signal at a given point in time.

With this method it is evident that for higher frequency signals, the sum of the differences becomes larger. This is because the signal strength values at adjacent samples for a higher frequency signal have a larger difference (i.e., faster signal change) than the adjacent sample values for a lower frequency signal.

The difference lock technique can be used instead of computing the area or phase of the LF signal such that the sum of the differences of the LF signal is compared to a setpoint characteristic such as a setpoint number $S_{min}$ representing the sum of the differences of the LF signal computed over a predetermined period of time when the static magnetic field is at resonance. Preferably, the minimum sum of the differences $S_{min}$ is continually computed as the scan progresses and the static field is brought into resonance. The $S_{min}$ of the LF signal will thus slightly change during the scan and is therefore ideally updated such that if the sum is less than the previous sum, it then becomes the new $S_{min}$. The field change or frequency change is then proportional to $$|S - S_{min}|$$

to correct for field drifts of the static magnetic field. The zero-crossing detection as described above can also be used in conjunction with computing the sum of the differences in order to provide a correction signal to the static magnetic field correction coils to return the system to resonance. Alternatively, the sum of the differences techniques can be implemented alone without zero-crossing detection to correct field drifts in the static magnetic field.

With the sum of the differences technique employed, the test sequence for determining the sign of the difference between the frequency of the acquired NMR signal and the desired setpoint frequency can be determined from the portions of the Fourier transform of the LF signal rather than monitoring change in area of the LF signal. Thus, if the area under the curve near component zero of the Fourier transform is greater than the area near the maximum component of the Fourier transform, then the magnetic field has increased past its desired resonance value. By contrast, if the area near a maximum component of the Fourier transform is greater than the component near zero, then the magnetic field has decreased from the resonance value and the proper adjustment to the correction coils can therefore be made. Preferably, the maximum component of the Fourier transform used is component number 511 as this represents a far enough component to achieve good accuracy.

A further refinement to determining the sign of the frequency change from the amplitude of the Fourier transform can be used since the area of the near zero component and the maximum component are not exactly equal at resonance. Thus, for the near zero component and the maximum component, the sum of the differences "minimum state" ($S_{min}$) can be computed. When the areas are computed to see whether the field is increased or decreased, the system can monitor deviations from the minimum areas as follows:

$$A - A_{min\phi} \text{ near min. component } \phi \equiv A_\phi$$

$$A - A_{min511} \text{ near max component } 511 \equiv A_{max}.$$

Thus for a shifting magnetic frequency, if $A_\phi$ is greater than $A_{max}$ the magnetic field is increased and the field must be shifted in one direction, while if $A_\phi$ is less than $A_{max}$ then the change in the magnetic field has decreased and the field must be shifted in the opposite direction. Again, because this method involves computation of the Fourier transform of the LF signal, it requires more computation than the use of the area in zero-crossing methods described above. However, with processing cost decreasing, the above method can also be economically and commercially viable.

A second refinement preferably added to the difference lock method discussed above occurs because there are two possible states within a minimum S as shown in FIG. 5, including state 500 and state 502. Because state 500 is the preferred state, the software shifts the static magnetic field to force the preferred state 500 based on the initial sign of the LF signal. This lock technique can recover from very large shifts in the static magnetic field but requires more computation and thus may take a longer time to determine a proper field correction. In addition, this lock system has no unstable states.

The present invention therefore solves the problems associated with prior lock systems and such systems where analog integrators is used. Such integrators include little to no intelligence, rely on manual control knobs for tuning, suffer from baseline drift, and are not automatically calibrating. Such systems simply cannot handle large magnetic drifts to pull back static magnetic field to resonance.

As these and other variations and combinations of the features discussed above can be utilized without departing from the present invention as defined by the claims, the foregoing description of the preferred embodiments should be taken by way of illustration rather than by way of limitation of the present invention.

What is claimed is:

1. A method of stabilizing the static magnetic field in a magnetic resonance imaging (MRI) system comprising:
   (a) applying an excitation pulse to a test sample disposed in the static magnetic field and acquiring a nuclear magnetic resonance (NMR) signal from the test sample;
   (b) determining a number of features observed in a signal indicative of the NMR signal during a first predetermined period of time;
   (c) ascertaining a value of a characteristic observed in a signal indicative of the NMR signal during a second predetermined period of time, wherein the characteristic comprises signal area obtained by integrating the signal indicative of the NMR signal over the second predetermined period of time; and
   (d) applying a correction signal based on the number of recurring features and the value of the characteristic to adjust the static magnetic field until the NMR signal reaches a setpoint frequency at which the number of recurring features reaches a setpoint number and the value of the characteristic reaches a setpoint value, wherein said setpoint value comprises a desired signal area.

2. A method as claimed in claim 1, further comprising the steps of demodulating the acquired NMR signal with a reference signal to obtain a low frequency signal and determining the signal area from the low frequency signal.

3. A method as claimed in claim 2, wherein said setpoint value is zero.

4. A method of stabilizing the static magnetic field in a magnetic resonance imaging (NMR) system comprising:
   (a) applying an excitation pulse to a test sample disposed in the static magnetic field and acquiring a nuclear magnetic resonance (NMR) signal from the test sample;
   (b) determining a number of features observed in a signal indicative of the NMR signal during a first predetermined period of time;
   (c) ascertaining a value of a characteristic observed in a signal indicative of the NMR signal during a second predetermined period of time, wherein the characteristic comprises a phase value of the signal indicative of the NMR signal; and
   (d) applying a correction signal based on the number of recurring features and the value of the characteristic to adjust the static magnetic field until the NMR signal reaches a setpoint frequency at which the number of recurring features reaches a setpoint number and the value of the characteristic reaches a setpoint value, wherein said setpoint value comprises a desired phase value.

5. A method as claimed in claim 4, further comprising the steps of demodulating the acquired NMR signal with a reference signal to obtain a low frequency signal and determining the phase value from the low frequency signal.

6. A method as claimed in claim 5, wherein the phase value is determined from the Fourier transform of the low frequency signal and the desired phase value is 180 degrees.

7. A method of stabilizing the static magnetic field in a magnetic resonance imaging (MRI) system comprising:
   (a) applying an excitation pulse to a test sample disposed in the static magnetic field and acquiring a nuclear magnetic resonance (NMR) signal from the test sample;
   (b) determining a number of features observed in a signal indicative of the NMR signal during a first predetermined period of time;
   (c) ascertaining a value of a characteristic observed in a signal indicative of the NMR signal during a second predetermined period of time, wherein the characteristic comprises a sum of differences value obtained by computing the sum of differences of sampled values of the signal indicative of the NMR signal; and
   (d) applying a correction signal based on the number of recurring features and the value of the characteristic to adjust the static magnetic field until the NMR signal reaches a setpoint frequency at which the number of recurring features reaches a setpoint number and the value of the characteristic reaches a setpoint value, wherein said setpoint value represents a desired sum of the differences of sampled values.

8. A method as claimed in claim 7, further comprising the steps of demodulating the acquired NMR signal with a reference signal to obtain a low frequency signal and determining the sum of the differences value from the low frequency signal.

9. A method as claimed in claim 8, wherein the sum of the differences is computed from the equation:

$$S = \sum_{i=0}^{N-1} |E_{i+1} - E_i|$$

where S is the sum of differences, N is the number of sample points taken of the low frequency signal and E is the signal strength of the low frequency signal at the given sample value.

10. A method of stabilizing the static magnetic field in a magnetic resonance imaging (MRI) system comprising:
   (a) applying an excitation pulse to a test sample disposed in the static magnetic field and acquiring a nuclear magnetic resonance (NMR) signal from the test sample;
   (b) determining a number of features observed in a signal indicative of the NMR signal during a first predetermined period of time;

(c) ascertaining a value of a characteristic observed in a signal indicative of the NMR signal during a second predetermined period of time;

(d) applying a correction signal based on the number of recurring features and the value of the characteristic to adjust the static magnetic field until the NMR signal reaches a setpoint frequency at which the number of recurring features reaches a setpoint number and the value of the characteristic reaches a setpoint value; and (e) determining a sign of the difference in frequency between the acquired NMR signal and the setpoint frequency after application of the correction signal and adjusting said correction signal based upon the sign of the difference.

11. A method as claimed in claim 10, further comprising the step of observing the change in the number of recurring features after the application of the correction signal to determine the sign of the difference.

12. A method as claimed in claim 11, wherein said step of adjusting said correction signal includes the steps of multiplying the correction signal by a direction constant to temporarily change the direction of the correction signal when the static magnetic field has moved further away from a desired value after the application of the correction signal such that subsequent application of an adjusted correction signal will move the static magnetic field to a nondesired value, and adding a jump signal to the correction signal to move the static magnetic field from the nondesired value to the desired value where the NMR signal reaches the setpoint frequency.

13. A method as claimed in claim 11, further comprising the step of demodulating the acquired NMR signal with first and second reference signals having different frequencies to obtain first and second low frequency signals and wherein the sign of the difference is determined by determining the difference in the number of recurring features present in the first and second low frequency signals.

14. A method as claimed in claim 10, wherein said step of determining the sign of the difference comprises the steps of:

(a) computing the Fourier transform of the signal indicative of the NMR signal, (b) computing the integral of a first component of the Fourier transform and the integral of a later occurring component of the Fourier transform, and (c) determining the sign of the difference by comparing the difference between the integral of the first component with the integral of the later occurring component of the Fourier transform.

15. A method as claimed in claim 14, wherein the later occurring component comprises the 511th component of the Fourier transform.

16. A method of stabilizing the static magnetic field in a magnetic resonance imaging (MRI) system comprising:

(a) applying an excitation pulse to a test sample disposed in the static magnetic field and acquiring a nuclear magnetic resonance (NMR) signal from the test sample;

(b) determining a number of features observed in a signal indicative of the NMR signal during a first predetermined period of time;

(c) ascertaining a value of a characteristic observed in a signal indicative of the NMR signal during a second predetermined period of time, wherein the characteristic comprises signal area obtained by digitizing the signal indicative of the NMR signal with an analog-to-digital (A/D) converter to obtain a series of digitized signal values and integrating said digitized signal by summing said digitized signal values; and (d) applying a correction signal based on the number of recurring features and the value of the characteristic to adjust the static magnetic field until the NMR signal reaches a setpoint frequency at which the number of recurring features reaches a setpoint number and the value of the characteristic reaches a setpoint value.

17. A method as claimed in claim 16, further comprising the steps of:

(a) directing a calibration signal having a known average value to said A/D converter during a calibration period so that said calibration signal is digitized to yield a plurality of digitized calibration signal values and summing said digitized calibration signal values to yield an integrated calibration signal;

(b) calculating an average system offset value from (i) said integrated calibration signal, (ii) the number of digitized calibration signal values summed to form said integrated calibration signal and (iii) said known average value of said calibration signal; and (c) adding said average system offset value to each digitized sample value of the signal indicative of the NMR signal provided by said A/D converter during said step of digitizing.

18. A method as claimed in claim 17, wherein said A/D converter comprises multi-bit signal output means for generating a multi-bit output signal indicative of the digitized sample value of the signal indicative of the NMR signal, each said multi-bit output signal including a plurality of bits ranging from a most significant bit to a least significant bit, said step of adding said average offset value to each digitized sample value including the step of concatenating a set of correction bits representing said average system offset value with said multi-bit offset signal to thereby form a composite offset-corrected signal, said concatenating step being performed so that in said composite offset-corrected signal, at least some of said correction bits are less significant than the least significant bit in the multi-bit output signal.

19. A method as claimed in claim 18, wherein said composite offset-corrected signal comprises A bits of which the B least significant bits represent fractional values of said average offset value.

20. A method as claimed in claim 19, wherein A is 40 and B is 8.

21. A method as claimed in claim 17, wherein said calibration signal is an AC signal having zero average value.

22. A method as claimed in claim 21, further comprising the steps of demodulating the acquired NMR signal with a reference signal to obtain a low frequency signal and wherein said AC signal comprises a portion of the low frequency signal.

23. A method as claimed in claim 21, wherein said calibration period is substantially larger than the period of said AC signal whereby said average value will be proportional to the DC offset of the A/D converter.

24. A method of stabilizing the static magnetic field in a magnetic resonance imaging (MRI) system comprising:

(a) applying an excitation pulse to a test sample disposed in the static magnetic field and acquiring a nuclear magnetic resonance (NMR) signal from the test sample;

(b) determining a number of recurring features observed in a signal indicative of the NMR signal during a first predetermined period of time and further comprising the step of setting a hysteresis value as a percentage of a maximum amplitude of the signal indicative of the NMR signal and disregarding recurring features if the recurring features are not associated with a transition between a maximum and a minimum of the signal indicative of the NMR signal which differ from one another by more than said hysteresis value, whereby extraneous recurring features in the signal indicative of the NMR signal caused by noise or the like are filtered out and disregarded when determining the number of recurring features;

(c) ascertaining a value of a characteristic observed in a signal indicative of the NMR signal during a second predetermined period of time; and (d) applying a correction signal based on the number of recurring features and the value of the characteristic to adjust the static magnetic field until the NMR signal reaches a setpoint frequency at which the number of recurring features reaches a setpoint number and the value of the characteristic reaches a setpoint value.

25. A method as claimed in claim 24, wherein said hysteresis value is repeatedly determined each time the signal indicative of the NMR signal is obtained.

26. A method as claimed in claim 25, wherein said hysteresis value is chosen as a percentage of the maximum amplitude of the signal indicative of the NMR signal.

27. A method as claimed in claim 26, wherein said chosen percentage is 8 percent.

28. A method of stabilizing the static magnetic field in a magnetic resonance imaging (MRI) system comprising:

(a) applying an excitation pulse to a test sample disposed in the static magnetic field and acquiring a nuclear magnetic resonance (NMR) signal from the test sample;

(b) determining a number of features observed in a signal indicative of the NMR signal during a first predetermined period of time;

(c) ascertaining a value of a characteristic observed in a signal indicative of the NMR signal during a second predetermined period of time;

(d) applying a correction signal based on the number of recurring features and the value of the characteristic to adjust the static magnetic field until the NMR signal reaches a setpoint frequency at which the number of recurring features reaches a setpoint number and the value of the characteristic reaches a setpoint value; and (e) temporarily discarding acquired imaging information from the MRI system if the difference between the NMR signal and the setpoint frequency is greater than a predetermined threshold value.

29. A method of stabilizing the static magnetic field in a magnetic resonance imaging (MRI) system comprising:

(a) applying an excitation pulse to a test sample disposed in the static magnetic field and acquiring a nuclear magnetic resonance (NMR) signal from the test sample;

(b) determining a number of recurring features observed in a signal indicative of the NMR signal during a first predetermined period of time;

(c) ascertaining a value of a characteristic observed in a signal indicative of the NMR signal during a second predetermined period of time;

(d) applying a correction signal based on the number of recurring features and the value of the characteristic to adjust the static magnetic field until the NMR signal reaches a setpoint frequency at which the number of recurring features reaches a setpoint number and the value of the characteristic reaches a setpoint value; and (e) temporarily discarding acquired imaging information from the MRI system if the difference between the number of recurring features and the setpoint number is greater than a predetermined threshold value.

30. A method of stabilizing the static magnetic field in a magnetic resonance imaging (MRI) system comprising the steps of:

(a) applying an excitation pulse to a test sample disposed in the static magnetic field and acquiring a nuclear magnetic resonance (NMR) signal from the test sample;

(b) determining a number of features observed in a signal indicative of the NMR signal during a first predetermined period of time;

(c) ascertaining a value of a characteristic observed in a signal indicative of the NMR signal during a second predetermined period of time;

(d) applying a correction signal based on the number of recurring features and the value of the characteristic to adjust the static magnetic field until the NMR signal reaches a setpoint frequency at which the number of recurring features reaches a setpoint number and the value of the characteristic reaches a setpoint value; and (e) temporarily discarding acquired imaging information from the MRI system if the difference between the value of the characteristic and the setpoint value is greater than a predetermined threshold value.

31. A method of stabilizing the static magnetic field in a magnetic resonance imaging (MRI) system comprising:

(a) applying an excitation pulse to a test sample disposed in the static magnetic field and acquiring a nuclear magnetic resonance (NMR) signal from the test sample;

(b) determining a number of recurring features observed in a signal indicative of the NMR signal during a first predetermined period of time;

(c) ascertaining a value of a characteristic observed in a signal indicative of the NMR signal during a second predetermined period of time;

(d) applying a correction signal based on the number of recurring features and the value of the characteristic to adjust the static magnetic field until the NMR signal reaches a setpoint frequency at which the number of recurring features reaches a setpoint number and the value of the characteristic reaches a setpoint value; and (e) demodulating the acquired NMR signal with a reference signal to obtain a low frequency signal, and determining both the number of features and the value of the characteristic from the low frequency signal.

32. A method as claimed in claim 31, wherein the number of features are determined from a signal representing the area of the low frequency signal.

33. A method as claimed in claim 31, wherein said first and second predetermined periods of time are the same.

34. A method as claimed in claim 31, wherein the features are recurring features and comprise zero-crossings of the low frequency signal.

35. A method of stabilizing the static magnetic field in a magnetic resonance imaging (MRI) system comprising the steps of:

(a) applying an excitation pulse to a test sample disposed in the static magnetic field and acquiring a nuclear magnetic resonance (NMR) signal from the test sample;

(b) ascertaining the sum of differences of sampled values of a signal indicative of the NMR signal; and (c) applying a correction signal based upon a difference between the sum of differences and a setpoint value to adjust the static magnetic field until the NMR signal reaches a setpoint frequency at which said sum of differences reaches a setpoint value.

36. A method as claimed in claim 35, wherein the sum of the differences is computed from the equation:

$$S = \sum_{i=0}^{N-1} |E_{i+1} - E_i|$$

where S is the sum of differences, N is the number of sample points taken of the signal indicative of the NMR signal and E is the signal strength of the signal indicative of the NMR signal at the given sample value.

37. Apparatus for stabilizing the static magnetic field in a magnetic resonance imaging (MRI) system comprising:

(a) means for applying an excitation pulse to a test sample disposed in the static magnetic field and means for acquiring a nuclear magnetic resonance (NMR) signal from the test sample;

(b) means for determining a number of features observed in a signal indicative of the NMR signal during a first predetermined period of time;

(c) means for ascertaining a value of a characteristic observed in a signal indicative of the NMR signal during a second predetermined period of time;

(d) means for generating a correction signal based on the number of recurring features and the value of the characteristic;

(e) one or more static field correction coils for adjusting the static magnetic field based on the correction signal; and (f) means for applying the correction signal to said static field correction coils for adjusting until the NMR signal reaches a setpoint frequency at which the number of recurring features reaches a setpoint number and the value of the characteristic reaches a setpoint value.

38. Apparatus as claimed in claim 37, further comprising a programmable power supply for driving said correction coils and means for applying said correction signal as an input voltage to said programmable power supply.

39. Apparatus as claimed in claim 37, further comprising an imaging volume disposed within said static magnetic field.

40. Apparatus as claimed in claim 39, wherein said static field correction coils are located within said imaging volume.

41. Apparatus as claimed in claim 39, wherein said static field correction coils are located outside of said imaging volume.

42. Apparatus as claimed in claim 39, wherein said test sample is disposed outside of said imaging volume.

43. Apparatus as claimed in claim 39, wherein said test sample is fiducial slice of object containing a region of interest to be imaged, said fiducial slice being disposed outside said region of interest of said object.

44. Apparatus as claimed in claim 39, wherein said test sample is a fiducial object independent of an object to be imaged.

45. Apparatus as claimed in claim 39, wherein said test sample has resonant frequency different from the resonant frequency of the object to be imaged.

46. Apparatus as claimed in claim 45, wherein said test sample is fluorine.

47. Apparatus for stabilizing the static magnetic field in a magnetic resonance imaging (MRI) system comprising:

(a) means for applying an excitation pulse to a test sample disposed in the static magnetic field and means for acquiring a nuclear magnetic resonance (NMR) signal from the test sample;

(b) means for determining a number of features observed in a signal indicative of the NMR signal during a first predetermined period of time;

(c) means for integrating the signal indicative of the NMR signal over the second predetermined period of time for ascertaining a value of a characteristic observed in a signal indicative of the NMR signal during a second predetermined period of time;

(d) means for generating a correction signal based on the number of recurring features and the value of the characteristic;

(e) means for adjusting the static magnetic field based on the correction signal; and (f) means for applying the correction signal to said means for adjusting until the NMR signal reaches a setpoint frequency at which the number of recurring features reaches a setpoint number and the value of the characteristic reaches a setpoint value comprising a desired signal area.

48. Apparatus as claimed in claim 47, further comprising means for demodulating the acquired NMR signal with a reference signal to obtain a low frequency signal and means for determining the signal area from the low frequency signal.

49. Apparatus for stabilizing the static magnetic field in a magnetic resonance imaging (MRI) system comprising:

(a) means for applying an excitation pulse to a test sample disposed in the static magnetic field and means for acquiring a nuclear magnetic resonance (NMR) signal from the test sample;

(b) means for determining a number of features observed in a signal indicative of the NMR signal during a first predetermined period of time;

(c) means for determining a phase value of the signal indicative of the NMR signal for ascertaining a value of a characteristic observed in a signal indicative of the NMR signal during a second predetermined period of time;

(d) means for generating a correction signal based on the number of recurring features and the value of the characteristic;

(e) means for adjusting the static magnetic field based on the correction signal; and (f) means for applying the correction signal to said means for adjusting until the NMR signal reaches a setpoint frequency at which the number of recurring features reaches a setpoint number and the value of the characteristic reaches a setpoint value comprising a desired phase value.

50. Apparatus as claimed in claim 49, further comprising means for demodulating the acquired NMR signal with a reference signal to obtain a low frequency signal and means for determining the phase value from the low frequency signal.

51. Apparatus for stabilizing the static magnetic field in a magnetic resonance imaging (MRI) system comprising:

(a) means for applying an excitation pulse to a test sample disposed in the static magnetic field and means for acquiring a nuclear magnetic resonance (NMR) signal from the test sample;

(b) means for determining a number of features observed in a signal indicative of the NMR signal during a first predetermined period of time;

(c) means for computing a sum of differences value obtained by computing the sum of differences of sampled values of the signal indicative of the NMR signal for ascertaining a value of a characteristic observed in a signal indicative of the NMR signal during a second predetermined period of time;

(d) means for generating a correction signal based on the number of recurring features and the value of the characteristic;

(e) means for adjusting the static magnetic field based on the correction signal; and (f) means for applying the correction signal to said means for adjusting until the NMR signal reaches a setpoint frequency at which the number of recurring features reaches a setpoint number and the value of the characteristic reaches a setpoint value representing a desired sum of the differences of sampled values.

52. Apparatus as claimed in claim 51, further comprising means for demodulating the acquired NMR signal with a reference signal to obtain a low frequency signal and means for determining the sum of the differences value from the low frequency signal.

53. Apparatus for stabilizing the static magnetic field in a magnetic resonance imaging (MRI) system comprising:

(a) means for applying an excitation pulse to a test sample disposed in the static magnetic field and means for acquiring a nuclear magnetic resonance (NMR) signal from the test sample;

(b) means for determining a number of features observed in a signal indicative of the NMR signal during a first predetermined period of time;

(c) means for ascertaining a value of a characteristic observed in a signal indicative of the NMR signal during a second predetermined period of time;

(d) means for generating a correction signal based on the number of recurring features and the value of the characteristic;

(e) means for adjusting the static magnetic field based on the correction signal;

(f) means for applying the correction signal to said means for adjusting until the NMR signal reaches a setpoint frequency at which the number of recurring features reaches a setpoint number and the value of the characteristic reaches a setpoint value; and (g) means for determining a sign of the difference in frequency between the acquired NMR signal and the setpoint frequency after application of the correction signal and means for adjusting the correction signal based upon the sign of the difference.

54. Apparatus as claimed in claim 53, wherein said means for adjusting the correction signal includes means for multiplying the correction signal by a direction constant to temporarily change the direction of the correction signal when the static magnetic field has moved further away from a desired value after the application of the correction signal such that subsequent application of an adjusted correction signal will move the static magnetic field to a nondesired value, and means for adding a jump signal to the correction signal to move the static magnetic field from the nondesired value to the desired value where the NMR signal reaches the setpoint frequency.

55. Apparatus as claimed in claim 53, wherein said means for determining the sign of the difference comprises:

(a) means for computing the Fourier transform of the signal indicative of the NMR signal, (b) means for computing the integral of a first component of the Fourier transform and the integral of a later occurring component of the Fourier transform, and (c) means determining the sign of the difference by comparing the difference between the integral of the first component with the integral the later occurring component of the Fourier transform.

56. Apparatus for stabilizing the static magnetic field in a magnetic resonance imaging (MRI) system comprising:

(a) means for applying an excitation pulse to a test sample disposed in the static magnetic field and means for acquiring a nuclear magnetic resonance (NMR) signal from the test sample;

(b) means for determining a number of features observed in a signal indicative of the NMR signal during a first predetermined period of time;

(c) means for digitizing the signal indicative of the NMR signal with an analog-to-digital (A/D) converter to obtain a series of digitized signal values and means for integrating said digitized signal by summing said digitized signal values for ascertaining a value of a characteristic observed in a signal indicative of the NMR signal during a second predetermined period of time;

(d) means for generating a correction signal based on the number of recurring features and the value of the characteristic;

(e) means for adjusting the static magnetic field based on the correction signal; and (f) means for applying the correction signal to said means for adjusting until the NMR signal reaches a setpoint frequency at which the number of recurring features reaches a setpoint number and the value of the characteristic reaches a setpoint value.

57. Apparatus as claimed in claim 56, further comprising:

(a) means for directing a calibration signal having a known average value to said A/D converter during a calibration period so that said calibration signal is digitized to yield a plurality of digitized calibration signal values and summing said digitized calibration signal values to yield an integrated calibration signal;

(b) means for calculating an average system offset value from (i) said integrated calibration signal, (ii) the number of digitized calibration signal values summed to form said integrated calibration signal and (iii) said known average value of said calibration signal; and (c) means for adding said average system offset value to each digitized sample value of the signal indicative of the NMR signal provided by said A/D converter during said step of digitizing.

58. Apparatus as claimed in claim 57, wherein said A/D converter comprises multi-bit signal output means for generating a multi-bit output signal indicative of the digitized sample value of the signal indicative of the NMR signal, each said multi-bit output signal including a plurality of bits ranging from a most significant bit to a least significant bit, said step of adding said average offset value to each digitized sample value including the step of concatenating a set of correction bits representing said average system offset value with said multi-bit offset signal to thereby form a composite offset-corrected signal, said concatenating step being performed so that in said composite offset-corrected signal, at least some of said correction bits are less significant than the least significant bit in the multi-bit output signal.

59. Apparatus for stabilizing the static magnetic field in a magnetic resonance imaging (MRI) system comprising:
    (a) means for applying an excitation pulse to a test sample disposed in the static magnetic field and means for acquiring a nuclear magnetic resonance (NMR) signal from the test sample;
    (b) means for determining a number of recurring features observed in a signal indicative of the NMR signal during a first predetermined period of time and said means for determining the number of recurring characteristics further comprising means for setting a hysteresis value as a percentage of a maximum amplitude of the signal indicative of the NMR signal and means for disregarding recurring features if the recurring features are not associated with a transition between a maximum and a minimum of the signal indicative of the NMR signal which differ from one another by more than said hysteresis value, whereby extraneous recurring features in the signal indicative of the NMR signal caused by noise or the like are filtered out and disregarded in the step of determining the number of recurring features;
    (c) means for ascertaining a value of a characteristic observed in a signal indicative of the NMR signal during a second predetermined period of time;
    (d) means for generating a correction signal based on the number of recurring features and the value of the characteristic;
    (e) means for adjusting the static magnetic field based on the correction signal; and
    (f) means for applying the correction signal to said means for adjusting until the NMR signal reaches a setpoint frequency at which the number of recurring features reaches a setpoint number and the value of the characteristic reaches a setpoint value.

60. Apparatus for stabilizing the static magnetic field in a magnetic resonance imaging (MRI) system comprising:
    (a) means for applying an excitation pulse to a test sample disposed in the static magnetic field and means for acquiring a nuclear magnetic resonance (NMR) signal from the test sample;
    (b) means for determining a number of features observed in a signal indicative of the NMR signal during a first predetermined period of time;
    (c) means for ascertaining a value of a characteristic observed in a signal indicative of the NMR signal during a second predetermined period of time;
    (d) means for generating a correction signal based on the number of recurring features and the value of the characteristic;
    (e) means for adjusting the static magnetic field based on the correction signal;
    (f) means for applying the correction signal to said means for adjusting until the NMR signal reaches a setpoint frequency at which the number of recurring features reaches a setpoint number and the value of the characteristic reaches a setpoint value; and
    (g) means for temporarily discarding acquired imaging information from the MRI system if the difference between the NMR signal and the setpoint frequency is greater than a predetermined threshold value.

61. Apparatus for stabilizing the static magnetic field in a magnetic resonance imaging (MRI) system comprising:
    (a) means for applying an excitation pulse to a test sample disposed in the static magnetic field and means for acquiring a nuclear magnetic resonance (NMR) signal from the test sample;
    (b) means for determining a number of recurring features observed in a signal indicative of the NMR signal during a first predetermined period of time;
    (c) means for ascertaining a value of a characteristic observed in a signal indicative of the NMR signal during a second predetermined period of time;
    (d) means for generating a correction signal based on the number of recurring features and the value of the characteristic;
    (e) means for adjusting the static magnetic field based on the correction signal;
    (f) means for applying the correction signal to said means for adjusting until the NMR signal reaches a setpoint frequency at which the number of recurring features reaches a setpoint number and the value of the characteristic reaches a setpoint value; and
    (g) means for temporarily discarding acquired imaging information from the MRI system if the difference between the number of recurring features and the setpoint number is greater than a predetermined threshold value.

62. Apparatus for stabilizing the static magnetic field in a magnetic resonance imaging (MRI) system comprising:
    (a) means for applying an excitation pulse to a test sample disposed in the static magnetic field and means for acquiring a nuclear magnetic resonance (NMR) signal from the test sample;
    (b) means for determining a number of features observed in a signal indicative of the NMR signal during a first predetermined period of time;
    (c) means for ascertaining a value of a characteristic observed in a signal indicative of the NMR signal during a second predetermined period of time;
    (d) means for generating a correction signal based on the number of recurring features and the value of the characteristic;
    (e) means for adjusting the static magnetic field based on the correction signal;
    (f) means for applying the correction signal to said means for adjusting until the NMR signal reaches a setpoint frequency at which the number of recurring features reaches a setpoint number and the value of the characteristic reaches a setpoint value; and
    (g) means for temporarily discarding acquired imaging information from the MRI system if the difference between the value of the characteristic and the setpoint value is greater than a predetermined threshold value.

63. Apparatus for stabilizing the static magnetic field in a magnetic resonance imaging (MRI) system comprising:
    (a) means for applying an excitation pulse to a test sample disposed in the static magnetic field and means for acquiring a nuclear magnetic resonance (NMR) signal from the test sample;
    (b) means for determining a number of recurring features observed in a signal indicative of the NMR signal during a first predetermined period of time;
    (c) means for ascertaining a value of a characteristic observed in a signal indicative of the NMR signal during a second predetermined period of time;
    (d) means for generating a correction signal based on the number of recurring features and the value of the characteristic;

(e) means for adjusting the static magnetic field based on the correction signal;

(f) means for applying the correction signal to said means for adjusting until the NMR signal reaches a setpoint frequency at which the number of recurring features reaches a setpoint number and the value of the characteristic reaches a setpoint value; and (g) means for demodulating the acquired NMR signal with a reference signal to obtain a low frequency signal, and wherein both the number of recurring features and the value of the characteristic are determined from the low frequency signal.

64. A method as claimed in claim 63, wherein said first and second predetermined periods of time are the same.

65. A method as claimed in claim 63, wherein the features are recurring features and comprise zero-crossings of the low frequency signal.

66. Apparatus for stabilizing the static magnetic field in a magnetic resonance imaging (MRI) system comprising:

(a) means for applying an excitation pulse to a test sample disposed in the static magnetic field and means for acquiring a nuclear magnetic resonance (NMR) signal from the test sample;

(b) means for ascertaining the sum of differences of sampled values of a signal indicative of the NMR signal;

(c) means for generating a correction signal based the sum of differences of sampled values;

(d) means for adjusting the static magnetic field based on the correction signal; and (e) means for applying a correction signal based upon a difference between the sum of differences and a setpoint value to adjust the static magnetic field until the NMR signal reaches a setpoint frequency at which said sum of differences reaches a setpoint value.

67. Apparatus for stabilizing the static magnetic field in a magnetic resonance imaging (MRI) system comprising:

(a) a transmitter coil for applying an excitation pulse to a test sample disposed in the static magnetic field and a radio frequency antenna for acquiring a nuclear magnetic resonance (NMR) signal from the test sample;

(b) a computer programmed to (i) determine a number of features observed in a signal indicative of the NMR signal during a first predetermined period of time, (ii) ascertain a value of a characteristic observed in a signal indicative of the NMR signal during a second predetermined period of time, and (iii) generate a correction signal based on the number of recurring features and the value of the characteristic;

(c) one or more static field correction coils for adjusting the static magnetic field based on the correction signal; and (d) a DC amplifier for applying the correction signal to said static field correction coils until the NMR signal reaches a setpoint frequency at which the number of recurring features reaches a setpoint number and the value of the characteristic reaches a setpoint value.

68. Apparatus for stabilizing the static magnetic field in a magnetic resonance imaging (MRI) system comprising:

(a) a transmitter coil for applying an excitation pulse to a test sample disposed in the static magnetic field and radio frequency antenna for acquiring a nuclear magnetic resonance (NMR) signal from the test sample;

(b) a computer programmed to determine a number of features observed in a signal indicative of the NMR signal during a first predetermined period of time;

(c) a digital integrator for integrating the signal indicative of the NMR signal over the second predetermined period of time for ascertaining a value of a characteristic observed in a signal indicative of the NMR signal during a second predetermined period of time, said computer being further programmed to generate a correction signal based on the number of recurring features and the value of the characteristic;

(d) one or more static field correction coils for adjusting the static magnetic field based on the correction signal; and (e) a DC amplifier for applying the correction signal to said static field correction coils for adjusting until the NMR signal reaches a setpoint frequency at which the number of recurring features reaches a setpoint number and the value of the characteristic reaches a setpoint value comprising a desired signal area.

69. Apparatus for stabilizing the static magnetic field in a magnetic resonance imaging (MRI) system comprising:

(a) a transmitter coil for applying an excitation pulse to a test sample disposed in the static magnetic field and radio frequency antenna for acquiring a nuclear magnetic resonance (NMR) signal from the test sample;

(b) a computer programmed to determine a number of features observed in a signal indicative of the NMR signal during a first predetermined period of time;

(c) an analog-to-digital converter to digitize the signal indicative of the NMR signal to obtain a series of digitized signal values and a digital integrator for integrating said digitized signal by summing said digitized signal values for ascertaining a value of a characteristic observed in a signal indicative of the NMR signal during a second predetermined period of time, said computer being further programmed to generate a correction signal based on the number of recurring features and the value of the characteristic;

(d) one or more static field correction coils for adjusting the static magnetic field based on the correction signal; and (e) a DC amplifier for applying the correction signal to said static field correction coils for adjusting until the NMR signal reaches a setpoint frequency at which the number of recurring features reaches a setpoint number and the value of the characteristic reaches a setpoint value.

70. Apparatus for stabilizing the static magnetic field in a magnetic resonance imaging (MRI) system comprising:

(a) a transmitter coil for applying an excitation pulse to a test sample disposed in the static magnetic field and radio frequency antenna for acquiring a nuclear magnetic resonance (NMR) signal from the test sample;

(b) a computer programmed to ascertain the sum of differences of sampled values of a signal indicative of the NMR signal, and generate a correction signal based the sum of differences of sampled values;

(c) one or more static field correction coils for adjusting the static magnetic field based on the correction signal; and (d) a DC amplifier for applying a correction signal based upon a difference between the sum of differences and a setpoint value to adjust the static magnetic field until the NMR signal reaches a setpoint frequency at which said sum of differences reaches a setpoint value.

* * * * *

UNITED STATES PATENT AND TRADEMARK OFFICE
CERTIFICATE OF CORRECTION

PATENT NO. : 6,037,775
DATED : March 14, 2000
INVENTOR(S) : Shenoy, et. al.

It is certified that error appears in the above-indentified patent and that said Letters Patent is hereby corrected as shown below:

Title page, item [54],
In the Title, line 2, "A" should read --AN--.

Column 1, line 2, "A" should read --AN--.
Column 2, line 40, "a" should read --an--.
Column 3, line 29, delete the words "of the".
Column 5, line 9, "(AID)" should read --(A/D)--.
Column 12, line 15, "that" should read --than--.
Column 13, line 4, after "operation" insert the word --of--.
Column 17, line 18, "is" should read --are--.
Column 26, line 8, after "means" insert the word --for--.
Column 26, line 10, after "integral" insert the word --of--.
Column 29, line 27, after "based" insert the word --on--.
Column 30, line 56, after "based" insert the word --on--.

Signed and Sealed this

Twentieth Day of March, 2001

*Attest:*

NICHOLAS P. GODICI

*Attesting Officer*     Acting Director of the United States Patent and Trademark Office